(12) United States Patent
Hou et al.

(10) Patent No.: US 7,511,962 B2
(45) Date of Patent: Mar. 31, 2009

(54) FLEXIBLE PRINTED CIRCUIT BOARD

(75) Inventors: Ning Hou, Shenzhen (CN); Shing-Tza Liou, Taoyuan (TW)

(73) Assignees: FuKui Precision Component (Shenzhen) Co., Ltd., Shenzhen, Guangdong Province (CN); Foxconn Advanced Technology Inc., Tayuan, Taoyuan (TW)

( * ) Notice: Subject to any disclaimer, the term of this patent is extended or adjusted under 35 U.S.C. 154(b) by 0 days.

(21) Appl. No.: 11/960,656

(22) Filed: Dec. 19, 2007

(65) Prior Publication Data

US 2008/0285241 A1 Nov. 20, 2008

(30) Foreign Application Priority Data

May 18, 2007 (CN) .................... 2007 1 0074377

(51) Int. Cl.
*H05K 1/00* (2006.01)

(52) U.S. Cl. .................... 361/749; 174/255; 361/777

(58) Field of Classification Search .................. 361/749, 361/777; 174/255
See application file for complete search history.

(56) References Cited

U.S. PATENT DOCUMENTS

| 5,715,143 | A  | * | 2/1998  | McHugh et al. | ............ | 361/749 |
| 6,473,311 | B1 | * | 10/2002 | James et al.  | ................ | 361/777 |
| 6,617,671 | B1 | * | 9/2003  | Akram         | ........................ | 257/668 |
| 6,734,372 | B2 | * | 5/2004  | James et al.  | ................ | 174/260 |
| 7,323,642 | B2 | * | 1/2008  | Hwang et al.  | ............... | 174/255 |

* cited by examiner

*Primary Examiner*—Dean A. Reichard
*Assistant Examiner*—Andargie M Aychillhum
(74) *Attorney, Agent, or Firm*—Andrew C. Cheng

(57) ABSTRACT

A flexible printed circuit board includes a flexible base, a working trace region, and at least one reinforcement trace. The working trace region and the at least one reinforcement trace are formed on the flexible base. The working trace is formed by a number of working traces. In the flexible base, the at least one reinforcement trace is disposed at a periphery of the working trace region.

20 Claims, 5 Drawing Sheets

FLEXIBLE PRINTED CIRCUIT BOARD

BACKGROUND OF THE INVENTION

1. Field of the Invention

The present invention relates to printed circuit boards and, particularly, to a flexible printed circuit board with excellent flexibility.

2. Description of Related Art

Flexible printed circuit boards (FPCBs) are widely used in portable electronic devices such as mobile phones. Mobile phones, especially foldable mobile phones and sliding mobile phones, require flexible printed circuit board that can be repeatedly bent and re-bent.

Referring to FIG. 5, a typical flexible printed circuit board 10 is shown. The flexible printed circuit board 10 includes a flexible base film 11 and a signal trace pattern 12 formed on the flexible base film 11. When the flexible printed circuit board 10 is bent, shearing stresses in the flexible base film 11 can affect the signal trace pattern 12. In practice, the flexible printed circuit board 10 may be bent repeatedly or even over-bent, and thus the signal trace pattern 12 may be exposed to shearing stresses. This repeated exposure to shearing stresses can cause the signal trace pattern 12 to malfunction or become damaged.

Therefore, a flexible printed circuit board 10 with excellent flexibility performance is desired.

SUMMARY OF THE INVENTION

A flexible printed circuit board includes a flexible base, a working trace region, and at least one reinforcement trace. The working trace region and the at least one reinforcement trace are formed on the flexible base. The working trace region is formed by a number of working traces. In the flexible base, the at least one reinforcement trace is disposed at a periphery of the working trace region.

Advantages and novel features will become more apparent from the following detailed description when taken in conjunction with the accompanying drawings.

BRIEF DESCRIPTION OF THE DRAWINGS

Many aspects of the present flexible printed circuit board can be better understood with reference to the following drawings. The components in the drawings are not necessarily drawn to scale, the emphasis instead being placed upon clearly illustrating the principles of the present flexible printed circuit board. Moreover, in the drawings, like reference numerals designate corresponding parts throughout the several views.

DETAILED DESCRIPTION OF THE INVENTION

Embodiments will now be described in detail below and with reference to the drawings.

Figure 1:
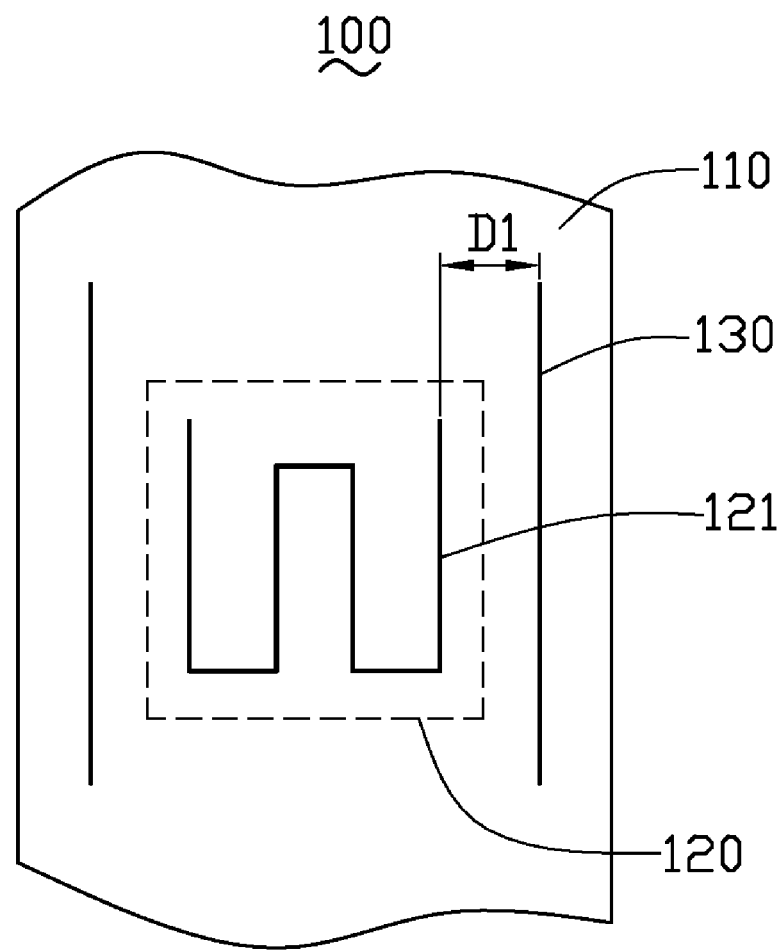
FIG. 1 is a schematic view of a flexible printed circuit board, in accordance with a present first embodiment.

Referring to FIG. 1, a flexible printed circuit board 100, in accordance with a first embodiment, is shown. The flexible printed circuit board 100 includes a flexible base 110, a number of working traces 121, and at least one reinforcement trace 130. The working traces 121 and the at least one reinforcement trace 130 are formed on the flexible base 110. The working traces 121 form a working trace region 120. That is, all of the working traces 121 formed on the flexible base 110 are located in the working trace region 120. Thus, the flexible base 110 includes two regions, i.e., one region is the working trace region 120, and the other region surrounding the working trace region 120 is called a periphery region (not labeled). The at least one reinforcement trace 130 is located in the periphery region. In the present embodiment, the working trace region 120 is designed in the center area of the flexible base 110. Two reinforcement traces 130 are respectively disposed on the two sides of the working trace region 120 along a lengthwise direction of the flexible base 110. That is, the working trace region 120 is positioned between the two reinforcement traces 130. The working trace region 120 defines a first end and a second end opposite to the first end along the lengthwise direction of the flexible base 110. Each of the reinforcement traces 130 has a third end and a fourth end opposite to the third end. Each of the reinforcement traces 130 extends along the lengthwise direction of the flexible base 110. The first and second ends of the working trace region 120 are located between the third ends of the reinforcement traces 130 and the fourth ends of the reinforcement traces 130.

In the operation of the flexible printed circuit board 100, the working traces 121 are used to transmit electrical signals. The reinforcement traces 130 are not used to transmit electrical signals. The two reinforcement traces 130 are used to undertake/absorb the shearing stress, generated by bending the flexible printed circuit board 100, so that the force of the shearing stress on the working traces 121 can be greatly reduced.

When integrated in a foldable or sliding phone, the flexible printed circuited boards with the reinforcement traces 130 can be repeatedly bent, however, most breaking/cracking occurs on the peripheral traces of the flexible printed circuited boards, e.g., the outermost traces. Therefore, in the present embodiment, the reinforcement traces 130 disposed in the periphery region of the flexible base 110 undergoes the most shearing stress generated by bending the flexible printed circuited board 100.

With respect to the present flexible printed circuited board 100, because of the present of the two reinforcement traces 130, the service life of the working traces 121 can be greatly extended. Specifically, when the flexible printed circuit board 100 is bent along the lengthwise direction of the flexible base 11, the shearing stress is not uniformly distributed in the flexible base 110. Generally, the peripheral region of the flexible base 110 will experience most of the shearing stress, and the center region (i.e., the working trace region 120) will experience less shearing stress. The reinforcement traces 130 are not part of electrical signal transmitting process, therefore, whether or not the reinforcement traces 130 breaks, the electrical signal transmitting process will not be interrupted or affected.

The reinforcement traces 130 can be made of conductive materials, such as copper, gold, silver or other appropriate materials. Alternatively, the reinforcement traces 130 may also be made of other materials, e.g., the flexible base materials. A distance (denoted by $D_1$) between each of the reinforcement traces 130 and the outermost working trace 121 in the working trace region 120 is in a range from above about zero millimeter to about 10 millimeters (i.e., $0 < D_1 \leq 10$ mm).

A width (denoted by $W_1$) of each of the reinforcement traces 130 is in a range from above about zero millimeter to about 0.5 millimeters (i.e., $0<W_1\leq0.5$ mm). Advantageously, the width of each of the reinforcement traces 130 is in a range from about 0.1 millimeters to about 0.5 millimeters.

In the present embodiment, each reinforcement trace 130 is a straight copper wire. The distance between each reinforcement trace 130 and the outermost working trace 121 is about 1 millimeter. The width of each reinforcement trace 130 is about 0.4 millimeter.

It is to be understood that the distance between each reinforcement trace 130 and the outermost working trace 121, and the width of each reinforcement trace 130, may be outside of the above described range (i.e., the distance is in a range from above about zero millimeter to about 10 millimeters, and the width is in a range from above about zero millimeter to about 0.5 millimeters), in accordance with the designed configuration of the flexible printed circuit board.

Figure 2:
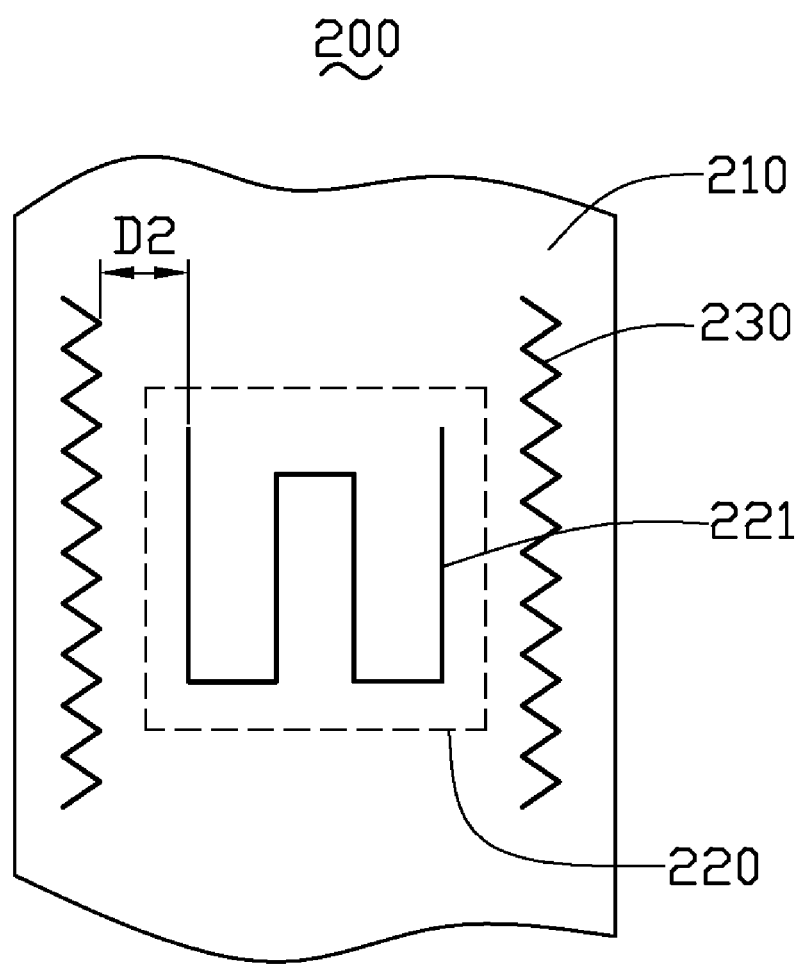
FIG. 2 is a schematic view of a flexible printed circuit board, in accordance with a present second embodiment.

Referring to FIG. 2, another flexible printed circuit board 200, in accordance with a second embodiment, is shown. The flexible printed circuit board 200 includes a flexible base 210, a working trace region 220 formed by a number of working traces 221, and two reinforcement traces 230. The present flexible printed circuit board 200 is similar to the flexible printed circuit board 100 of the first embodiment except the structure of the reinforcement traces 230. In the present embodiment, each of the reinforcement traces 230 is bent, angled, or curved (e.g., wavy or zigzag). The two zigzag reinforcement traces 230 respectively locates at the two sides of the working trace region 220 along a lengthwise direction of the flexible base 210. A minimal distance (denoted by $D_2$) between each reinforcement trace 230 and the outermost working trace in the working trace region 220 is in a range from above about zero millimeter to about 10 millimeters (i.e., $0<D_2\leq10$ mm). For example, the working trace 221 is the outermost working trace of the working trace region 220. The minimal distance between each reinforcement trace 230 and the working trace 221 is in a range from above about zero millimeter to about 10 millimeters. A width (denoted by $W_2$) of each reinforcement trace 230 is in a range from above about zero millimeter to about 0.5 millimeters (i.e., $0<W_2\leq0.5$ mm), advantageously, in a range from about 0.1 millimeters to about 0.5 millimeters.

It is to be understood that the shape of the reinforcement trace 130 is not limited to be straight, waved, and zigzag. The reinforcement trace 130 may also be other patterns, such as polygon, ellipse, or other regular or irregular pattern. Furthermore, with respect to the above shapes, each of the reinforcement trace 130 may be continuous or discontinuous. Moreover, the distance between the working traces of the working trace region 120 and the reinforcement trace 130 may be changed according to various trace configurations of flexible printed circuit boards.

Figure 3:
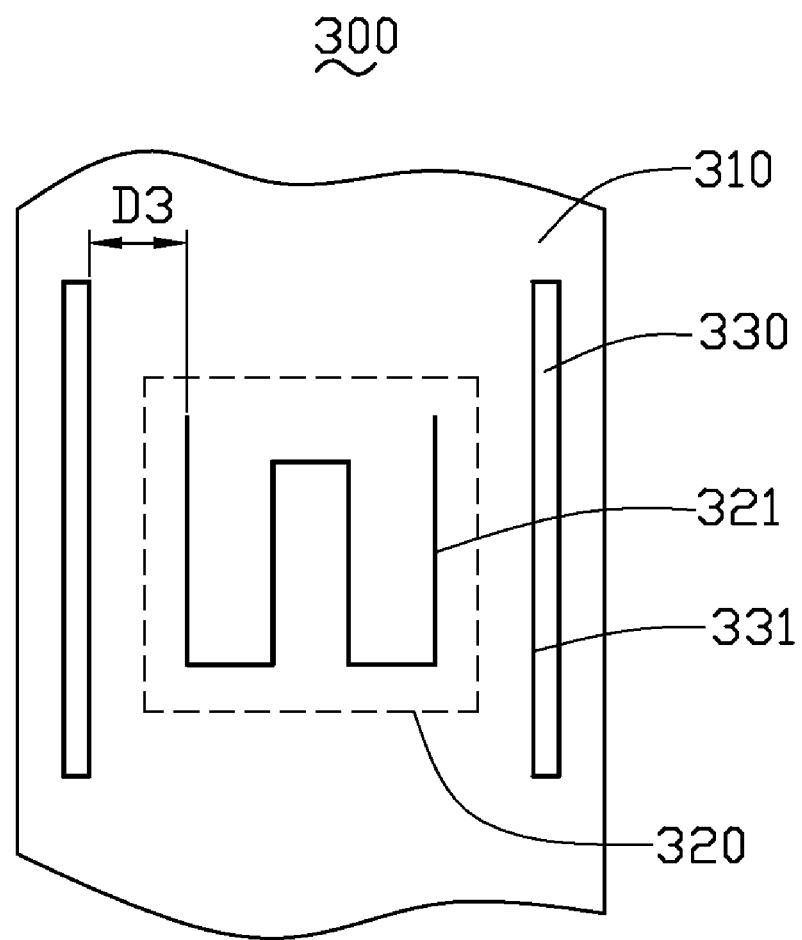
FIG. 3 is a schematic view of a flexible printed circuit board, in accordance with a present third embodiment.

Referring to FIG. 3, a flexible printed circuit board 300, in accordance with a third embodiment, is shown. The flexible printed circuit board 300 includes a flexible base 310, working trace region 320 formed by a number of working traces 321, and a reinforcement trace 330. The flexible printed circuit board 300 has a similar configuration to the flexible printed circuit board 100 of the first embodiment, except that the structure of the reinforcement trace 330 has been changed. In the present embodiment, the reinforcement trace 330 is a rectangular pattern. The rectangular reinforcement trace 330 has a side 331 closer to the outermost trace of the working trace region 320. In the present embodiment, the working trace 321 is the outermost trace of the working trace region 320. A distance $D_3$ between the working trace 321 and the side 331 of the reinforcement trace 330 is in a range from above about zero millimeter to about 10 millimeter (i.e., $0<D_3\leq10$ mm). A width $W_3$ of each side of the reinforcement trace 330 is in a range from above about zero millimeter to about 0.5 millimeters (i.e., $0<W_3\leq0.5$ mm), advantageously, in a range from about 0.1 millimeters to 0.5 millimeters.

Because of the pattern of the reinforcement trace 330, when the flexible printed circuit board 300 is bent, most of the shearing stresses can be undertaken or absorbed by the reinforcement trace 330 pattern. As a result, the working traces 321 of the working region 320 gain a longer service life. Thus, the working traces 321 of the working region 320 can be further protected.

Figure 4:
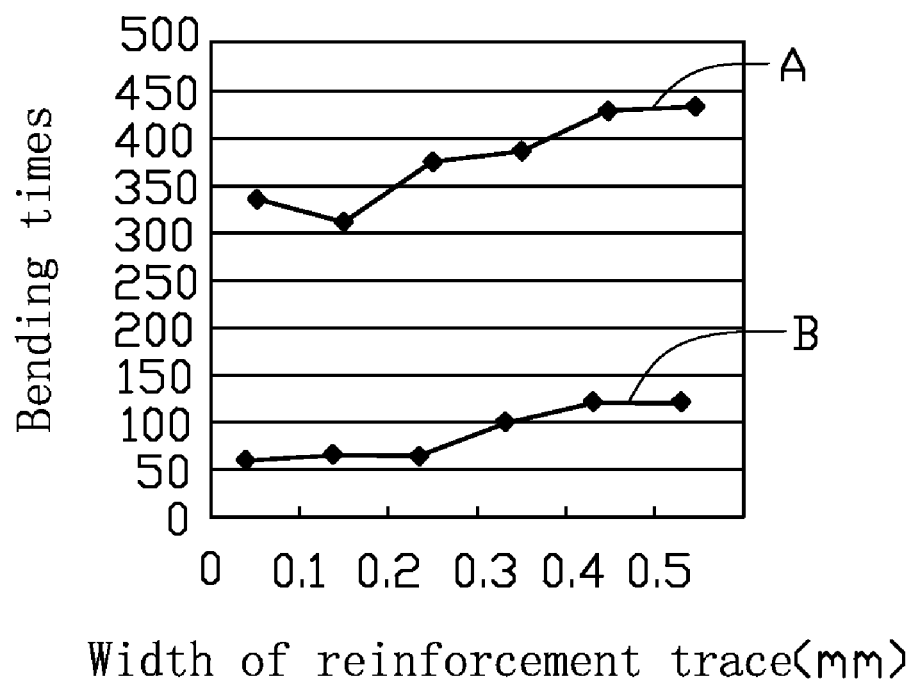
FIG. 4 is a graph, showing a relation of bending times and width of the reinforcement trace.
Figure 5:
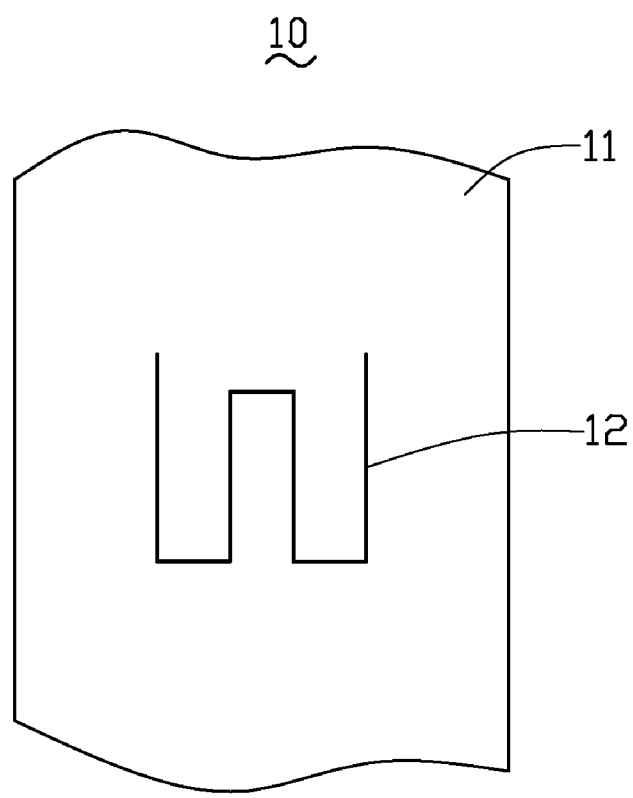
FIG. 5 is schematic view of a flexible printed circuit board, in accordance with prior art.

The width of the reinforcement trace can directly determine a bending times of a flexible printed circuit board. For example, regarding the flexible printed circuit board 100 of the first embodiment, a relationship of a width of a reinforcement trace 130 and the bend times of a flexible printed circuit board having the corresponding reinforcement trace 130 is shown in FIG. 4. In FIG. 4, a relationship curve is expressed in rectangular coordinate system. In the rectangular coordinate system, the abscissa represents the width of the reinforcement traces, and the ordinate represents the bending times of the flexible printed circuit board. For example, the working traces are copper wires, and the distance between the outmost working trace 121 and the reinforcement trace 130 is 1 millimeter. The width of the reinforcement trace 130 is in a range from above about zero millimeter to about 0.5 millimeters.

In another example, the width of working trace 121 is one millimeter. A numerical value of the width of the reinforcement trace 130 respectively is 0.05 millimeters, 0.1 millimeters, 0.2 millimeters, 0.3 millimeters, 0.4 millimeters, and 0.5 millimeters. Six flexible printed circuit boards having the above configurations are used. The number of bending times for breaking a working trace of each of the six flexible printed circuit boards are measured. Thus, six points can be graphed to express the relationship between the width of the reinforcement trace 130 and the bending times, as shown a curve A in FIG. 4.

For another example, a width of working trace 121 is equal to 3 mil (1 mil is equal to 0.25 micrometers). A numerical value of the width of the reinforcement trace 130 respectively is 0.05 millimeters, 0.1 millimeters, 0.2 millimeters, 0.3 millimeters, 0.4 millimeters, and 0.5 millimeters. Thus, six flexible printed circuit boards having the above configurations are used. The number of bending times of a working trace of each of the six flexible printed circuit boards are measured. Thus, six points can be graphed to express the relationship between the width of the reinforcement trace and the bending times, as shown a curve B in FIG. 4.

Referring to the curves A and B of FIG. 4, whether the width of the working traces is equal to one millimeter or equal to 3 mil, the wider the reinforcement trace, the more the bending times of the flexible printed circuit boards. Particularly, when the width of the reinforcement trace is equal to 0.4 millimeters, the flexible printed circuit board has the most bending times. Thus, the flexible printed circuit board has the best flexibility.

In summary, the adding of the reinforcement traces can improve the flexibility of flexible printed circuit boards, particularly, improve the service life of the working traces. Advantageously, adding reinforcement traces with various width in flexible printed circuit boards, the flexibility thereof can be improved with various degrees.

It is to be understood that the reinforcement traces only function to improve the flexibility of the flexible printed circuit boards. Therefore, with respect to all above embodiments, the reinforcement traces do not electrically connect to any working trace of the working trace region. In a process for manufacturing such flexible printed circuit boards, the reinforcement traces can be formed after the working traces have been finished. In addition, the reinforcement traces can also be made together with the making of the working traces. The reinforcement traces and the working traces can be manufactured using conventional method, such as chemical etching method.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A flexible printed circuit board, comprising:
    a flexible base defining a first end and an opposite second end along a lengthwise direction thereof;
    a working trace region formed on the flexible base, the working trace region being formed by a plurality of working traces, the working trace region defining a first end nearest the first end of the flexible base and an opposite second end nearest the second end of the flexible base; and
    at least one reinforcement trace formed on the flexible base, the reinforcement trace being disposed at a periphery of the working trace region;
    wherein the at least one reinforcement trace generally extends along the lengthwise direction of the flexible base and defines a first end nearest the first end of the flexible base and an opposite second end nearest the second end of the flexible base, the first end of the at least one reinforcement trace is nearer the first end of the flexible base than is the first end of the working trace region, and the second end of the at least one reinforcement trace is nearer the second end of the flexible base than is the second end of the working trace region.

2. The flexible printed circuit board as claimed in claim 1, wherein the at least one reinforcement trace is disposed at two sides of the working trace region along the lengthwise direction of the flexible base.

3. The flexible printed circuit board as claimed in claim 1, wherein the at least one reinforcement trace is a straight line, a curved line, or a zigzag line.

4. The flexible printed circuit board as claimed in claim 1, wherein a distance between an outermost working trace of the working trace region and the at least one reinforcement trace is in a range from above zero millimeters to about 10 millimeters.

5. The flexible printed circuit board as claimed in claim 1, wherein a width of the at least one reinforcement trace is in a range from above zero millimeters to about 0.5 millimeters.

6. The flexible printed circuit board as claimed in claim 1, wherein the at least one reinforcement trace is made of copper, gold, or silver.

7. The flexible printed circuit board as chimed in claim 1, wherein the at least one reinforcement trace is made of flexible base material.

8. The flexible printed circuit board as claimed in claim 1, wherein the at least one reinforcement trace is structured and arranged to absorb stress that would otherwise be applied to the working trace region in the case of bending of the flexible printed circuit board at any time after manufacture of the flexible printed circuit board has been completed.

9. The flexible printed circuit board as claimed in claim 3, wherein the at least one reinforcement trace is a continuous straight line, a continuous curved line, or a continuous zigzag line.

10. The flexible printed circuit board as claimed in claim 3, wherein the at least one reinforcement trace is a discontinuous straight line, a discontinuous curved line, or a discontinuous zigzag line.

11. The flexible printed circuit board as claimed in claim 5, wherein a width of the at least one reinforcement trace is in a range from about 0.1 millimeters to about 0.5 millimeters.

12. The flexible printed circuit board as claimed in claim 11, wherein a width of the at least one reinforcement trace is about 0.4 millimeters.

13. A flexible printed circuit board, comprising:
    a flexible base defining a first end and an opposite second end along a lengthwise direction thereof;
    two parallel reinforcement traces formed on the flexible base each generally extending along the lengthwise direction of the flexible base; and
    a plurality of working traces formed on the flexible base in a working trace region, the working trace region located between the reinforcement traces;
    wherein each of the reinforcement traces defines a third end nearest the first end of the flexible base and an opposite fourth end nearest the second end of the flexible base, and the working trace region is located between the third ends of the reinforcement traces and the fourth ends of the reinforcement traces.

14. The flexible printed circuit board as claimed in claim 13, wherein at least one of the reinforcement traces is selected from the group consisting of a straight line, a curved line, and a zigzag line.

15. The flexible printed circuit board as claimed in claim 13, wherein a distance between an outermost working trace of the working trace region and a nearest one of the reinforcement traces is in a range from above zero millimeters to about 10 millimeters.

16. The flexible printed circuit board as claimed in claim 13, wherein a width of at least one of the reinforcement traces is in a range from above zero millimeters to about 0.5 millimeters.

17. The flexible printed circuit board as claimed in claim 13, wherein at least one of the reinforcement traces is made of a selected one of copper, gold, and silver.

18. The flexible printed circuit board as claimed in claim 13, wherein at least one of the reinforcement traces is made of flexible base material.

19. The flexible printed circuit board as claimed in claim 14, wherein said at least one of the reinforcement traces is selected from the group consisting of a continuous straight line, a continuous curved line, and a continuous zigzag line.

20. The flexible printed circuit board as claimed in claim 14, wherein said at least one of the reinforcement traces is selected from the group consisting of a discontinuous straight line, a discontinuous curved line, and a discontinuous zigzag line.

* * * * *